United States Patent
Dargis et al.

(10) Patent No.: US 9,431,526 B2
(45) Date of Patent: Aug. 30, 2016

(54) HETEROSTRUCTURE WITH CARRIER CONCENTRATION ENHANCED BY SINGLE CRYSTAL REO INDUCED STRAINS

(71) Applicants: Rytis Dargis, Fremont, CA (US); Andrew Clark, Los Altos, CA (US); Erdem Arkun, San Carlos, CA (US)

(72) Inventors: Rytis Dargis, Fremont, CA (US); Andrew Clark, Los Altos, CA (US); Erdem Arkun, San Carlos, CA (US)

(73) Assignee: TRANSLUCENT, INC., Palo Alto, CA (US)

(*) Notice: Subject to any disclaimer, the term of this patent is extended or adjusted under 35 U.S.C. 154(b) by 191 days.

(21) Appl. No.: 14/487,820

(22) Filed: Sep. 16, 2014

(65) Prior Publication Data

US 2015/0069409 A1 Mar. 12, 2015

Related U.S. Application Data

(63) Continuation-in-part of application No. 13/774,962, filed on Feb. 22, 2013, now Pat. No. 8,878,188.

(51) Int. Cl.
| | |
|---|---|
| *H01L 29/778* | (2006.01) |
| *H01L 29/78* | (2006.01) |
| *H01L 29/20* | (2006.01) |
| *H01L 21/02* | (2006.01) |

(52) U.S. Cl.
CPC ....... *H01L 29/7783* (2013.01); *H01L 21/0245* (2013.01); *H01L 21/0254* (2013.01); *H01L 21/02381* (2013.01); *H01L 21/02433* (2013.01); *H01L 21/02458* (2013.01); *H01L 21/02488* (2013.01); *H01L 21/02502* (2013.01); *H01L 21/02505* (2013.01); *H01L 21/02516* (2013.01); *H01L 29/2003* (2013.01); *H01L 29/7787* (2013.01)

(58) Field of Classification Search
CPC ............. H01L 29/778; H01L 29/7782; H01L 29/7783; H01L 29/7786; H01L 29/7787; H01L 29/66446; H01L 29/66462; H01L 29/66522; H01L 21/02458; H01L 21/02505; H01L 21/02516; H01L 21/0254
See application file for complete search history.

(56) References Cited

U.S. PATENT DOCUMENTS

2014/0231818 A1* 8/2014 Arkun ................. H01L 21/0254
257/76

* cited by examiner

*Primary Examiner* — Matthew W Such
*Assistant Examiner* — Scott Stowe
(74) *Attorney, Agent, or Firm* — Robert A. Parsons; Michael W. Goltry; Parsons & Goltry

(57) ABSTRACT

A heterostructure grown on a silicon substrate includes a single crystal rare earth oxide template positioned on a silicon substrate, the template being substantially crystal lattice matched to the surface of the silicon substrate. A heterostructure is positioned on the template and defines at least one heterojunction at an interface between a III-N layer and a III-III-N layer. The template and the heterostructure are crystal matched to induce an engineered predetermined tensile strain at the at least one heterojunction. A single crystal rare earth oxide dielectric layer is grown on the heterostructure so as to induce an engineered predetermined compressive stress in the single crystal rare earth oxide dielectric layer and a tensile strain in the III-III-N layer. The tensile strain in the III-III-N layer and the compressive stress in the REO layer combining to induce a piezoelectric field leading to higher carrier concentration in 2DEG at the heterojunction.

29 Claims, 7 Drawing Sheets

| GaN, a | GaN, c | RARE-EARTH OXIDE | CUBIC (100) DIRECTION | (111) DIRECTION | GaN MISMATCH (A FILM-A SUB)/ A SUB, %) |
|---|---|---|---|---|---|
| 3.189 | | Lu2O3 (1/2) | 5.195 | 3.673 | -13.2 |
| 3.189 | | Yb2O3 (1/2) | 5.219 | 3.694 | -13.6 |
| 3.189 | | Sc2O3 (1/2) | 4.934 | 3.489 | -8.6 |
| 3.189 | | Si | 5.431 | 3.840 | -17.0 |
| 3.189 | | Er2O3 | 5.273 | 3.729 | -14.5 |
| 3.189 | | AlN | | 3.111 HEXAGONAL (A-DIRECTION) | +2.5 |

FIG. 3

HETEROSTRUCTURE WITH CARRIER CONCENTRATION ENHANCED BY SINGLE CRYSTAL REO INDUCED STRAINS

CROSS-REFERENCE TO RELATED APPLICATIONS

This is a continuation-in-part of copending U.S. patent application Ser. No. 13/774,962, filed 22 Feb. 2013.

FIELD OF THE INVENTION

This invention relates in general to the enhancement of 2DEG carrier density and reduced leakage current by single crystal rare earth oxide induced strain/stress in semiconductor devices including heterostructures.

BACKGROUND OF THE INVENTION

It is known that III-N based devices, such as GaN semiconductor devices, grown on a silicon substrate require gate dielectric material with sufficient dielectric constant and a proper band offset for good operating characteristics, e.g. low leakage currents and good gate control. In the prior art some attempts at using high-k polycrystalline materials have been unsuccessful. For example, polycrystalline $Hf_2O_3$ has been proposed for a gate dielectric. However, the material was found to be unsuitable because of leakage current paths via nanocrystallite grain boundaries and because crystal defects induce high interface state density which deteriorate electrical properties of the material.

Using $Er_2O_3$ as a gate dielectric to reduce leakage current in an MOS-HEMI device has been proposed by Lin et al. ("Physical and electrical characteristics of AlGaN/GaN metal-oxide semiconductor high-electron-mobility transistors with rare earth $Er_2O_3$ as a gate dielectric", *Thin Solid Films*, Vol. 544, pp. 526-529, (2013)). However, the HEMI is fabricated on a silicon substrate using an AlN buffer on which to grow the GaN base.

Using $Sc_2O_3$ as a gate dielectric to reduce leakage current in an MOS-HEMI device has been proposed by Mehandru et al. ("AlGaN/GaN metal-oxide-semiconductor high electron mobility transistors using $Sc_2O_3$ as the gate oxide and surface passivation", *Applied Physics Letters*, Vol. 82, No. 15, PP. 2530-2532, (14 Apr. 2003)). However, no mention is included as to the substrate (wafer) used.

In the semiconductor industry, it is known that growing III-N material, such as GaN, on a silicon substrate is difficult due in large part to the large crystal lattice mismatch (−16.9%) and the thermal mismatch (53%) between silicon and GaN. Thus, some type of buffer layer or layers is generally formed on the silicon substrate and the III-N material is grown on the buffer layer. Generally, the prior art buffer layers are either complicated and expensive to form or do not adequately reduce the strain in the GaN due to crystal lattice mismatch.

It would be highly advantageous, therefore, to remedy the foregoing and other deficiencies inherent in the prior art.

Accordingly, it is an object of the present invention to provide new and improved methods for the growth of heterostructures for use in semiconductor devices on silicon substrates.

It is another object of the present invention to provide new and improved methods for the growth of heterostructures on a silicon substrate for use in semiconductor devices and the growth of a template and gate dielectrics in the devices that provides stress/strain to enhance 2DEG carrier density.

It is another object of the present invention to provide new and improved gate dielectrics and new and improved methods for the growth of gate dielectrics for III-N devices on silicon substrates.

It is another object of the present invention to provide new and improved methods for the growth of III-N devices on a silicon substrate that includes engineered stress/strain in the final III-N material.

SUMMARY OF THE INVENTION

Briefly, the desired objects and aspects of the instant invention are realized in accordance with a heterostructure grown on a silicon substrate that includes a single crystal rare earth oxide template positioned on the silicon substrate. The template is substantially crystal lattice matched to the surface of the silicon substrate. A heterostructure is positioned on the template and defines at least one heterojunction at an interface between a III-N layer and a III-III-N layer. The template and the heterostructure are crystal matched to reduce strain at the at least one heterojunction. A single crystal rare earth oxide dielectric layer is grown on the heterostructure so as to induce an engineered predetermined tensile strain at the at least one heterojunction. The compressive stress in the III-N layer and the tensile strain in the III-III-N layer combine to induce a piezoelectric field leading to higher carrier concentration in 2DEG at the heterojunction.

The desired objects and aspects of the instant invention are further achieved in accordance with a preferred method of growing a heterostructure on a silicon substrate including the steps of growing or depositing a single crystal rare earth oxide template on a silicon substrate, the template being substantially crystal lattice matched to the surface of the silicon substrate. The method further includes growing or depositing a heterostructure on the template, the heterostructure defining at least one heterojunction at an interface between a III-N layer and a III-III-N layer. The template and the heterostructure are crystal matched to induce a predetermined amount of tensile strain at the at least one heterojunction. The method further includes growing or depositing a single crystal rare earth oxide dielectric layer on the heterostructure so as to induce a predetermined amount of compressive stress at the at least one heterojunction. The compressive stress in the III-N layer and the tensile strain in the III-III-N layer combine to induce a piezoelectric field leading to higher carrier concentration in 2DEG at the heterojunction.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which:

FIG. 3 is a chart Illustrating various GaN/REO relationships;

DETAILED DESCRIPTION OF THE DRAWINGS

Figure 1:
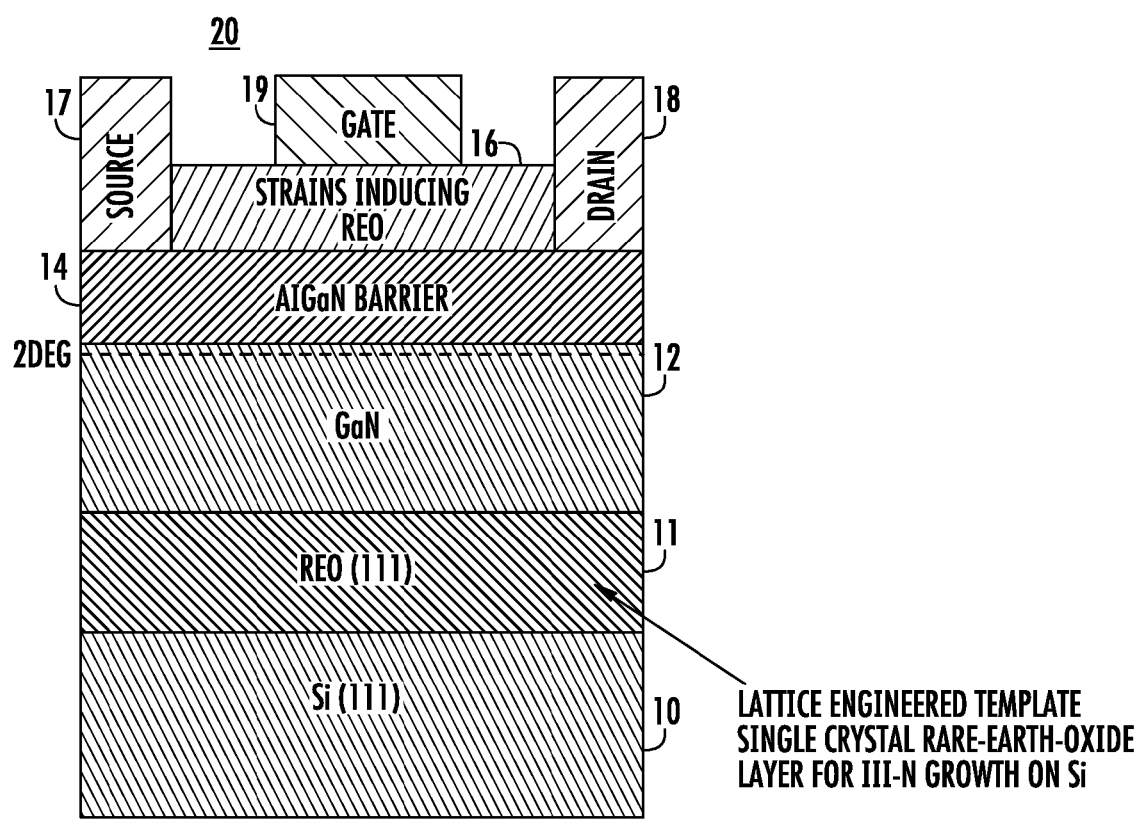
FIG. 1 is a simplified layer diagram illustrating a heterostructures on a REO template and a REO gate dielectric on a III-N device including the heterostructure with a stress-compensating/strain-inducing REO template, in accordance with the present invention.

Turning to FIG. 1, a simplified layer diagram is illustrated representing several steps in a process of growing a heterostructure on a REO template and a REO gate dielectric on the heterostructure to form a III-N device including the heterostructure, in accordance with the present invention. As will be understood from the description below, the term "heterostructure" is defined as including one or more heterojunctions, that is, two layers of III-N material forming an interface including 2DEG. It will be understood that silicon substrate 10 is or may be a standard well known single crystal wafer or portion thereof generally known and used in the semiconductor industry. Single crystal substrates, it will be understood, are not limited to any specific crystal orientation but could include (111) silicon, (110) silicon, (100) silicon or any other orientation or variation known and used in the art. The Si (100) and (111) substrates could also include various miscuts with nominal value between 0 and 10° in any direction. However, throughout this disclosure substrate 10 is illustrated with a preferred (111) orientation because of the simplification of further operations.

A stress compensating/engineered template 11 including rare earth oxide (REO) is epitaxially grown on silicon substrate 10. Various rare earth oxides have a crystal lattice spacing that can be matched to silicon with very little strain. For example, $Gd_2O_3$ has a crystal lattice spacing (a) of 10.81 Å, $Er_2O_3$ has a crystal lattice spacing (a) of 10.55 Å, $Nd_2O_3$ has a crystal lattice spacing (a) of 11.08 Å, and silicon has a double spacing (2a) of 10.86 Å. Further, the crystal lattice spacing of REO template 11 can be varied by varying the composition of the constituents, which allows for strain engineering of the silicon wafers. Generally, the REO material closest to or adjacent silicon substrate 10 will have a crystal spacing closest to the crystal spacing of silicon while REO materials adjacent the opposite (upper) side of REO template 11 will have a crystal spacing closer to the crystal spacing of materials grown on the surface. Also, at least the portion of REO template 11 adjacent silicon substrate 10 has a cubic crystal formation to match the crystal formation of silicon substrate 10. Basically, REO template 11 is a stress compensating template including one or more sub-layers (stepped or graded) of rare earth oxide defining, in conjunction with substrate 10 a "substrate structure". Strain engineering mitigates or controls the stresses/strains formed during growth of III-N materials and devices on these substrate structures.

In a typical example, REO template 11 includes $Gd_2O_3$ epitaxially grown on silicon substrate 10 with $Er_2O_3$ epitaxially grown adjacent the opposite (upper) side. In any case the REO materials can be grown in a graded fashion bridging the two compositions or split to have an abrupt change in the composition and/or constituents of template 11. Also, while two constituents are used in this example other and/or additional rare earth oxides can be included in template 11.

It should be noted that rare earth oxide is impervious to MBE process gasses, i.e. $N_2$ plasma, $NH_3$ and metallic Ga, which is the preferred growth process in this invention. Also, in the event that other growth processes are used, such as the MOCVD process, the rare earth oxide is also impervious to MOCVD process gasses ($NH_3$, $H_2$, TMGa, etc.). Reaction of silicon with process gasses usually results in etching of silicon ($H_2$), formation of nitrides ($NH_3$), or severe reaction and blistering (Ga precursor). Thus silicon substrate 10 is protected by REO template 11 from damage caused by generally all growth process gasses. Also, REO template 11 can be formed with a single continuous composition or it can be graded, in linear, stepwise or any similar schemes.

A III-N layer 12 is epitaxially grown on REO template 11 preferably by an MBE process. While in this specific example layer 12 is described as including gallium nitride (GaN), it should be understood that layer 12 could include any III-N material, such as AlN, GaN, InN, or combinations thereof. Generally, GaN layer 12 will be in a range of 50 nm to 2 μm thick, although thicker or thinner layers can be grown in some applications. Generally, GaN layer 12 is approximately 1 μm thick and there will be some engineered strain in GaN layer 12, i.e. the crystal lattice junction with REO template 11 produces some strain as described below. It should be understood that REO template 11 is engineered so that III-N layer 12 will be substantially crystal lattice matched to template 11, where the term "substantially" indicates the offset required to induce the desired amount of tensile strain. Also, any of the structures outlined below for further reducing or engineering strain in layer 12 can be included if desired.

Since there may still be some undesirable strain in GaN layer 12, it may in some applications be desirable to incorporate additional structure to further reduce that strain or engineer it to a desired level. As explained in a copending United States patent application entitled "AlN Inter-Layers in III-N Material Grown on REO/Silicon Substrate", Ser. No. 13/742,590, filed on 16 Jan. 2013, and incorporated herein by reference, a thin inter-layer of aluminum nitride (AlN) is epitaxially grown on the GaN layer to further reduce the strain. Preferably, the AlN inter-layer is in a range of approximately 1 nm to approximately 10 nm thick but for certain applications thicker or thinner films can be grown. Also, the AlN inter-layer can be grown using either a low or a high temperature process. A second layer of GaN is epitaxially grown on the AlN inter-layer. A second inter-layer of AlN is grown on the second GaN layer and this process is repeated n times or until the strain in the upper GaN or III-N layer has been reduced to an acceptable level. Basically, the strain formed during the growth of the GaN is controlled by insertion of the thin inter-layers of AlN, each of which allows the following layer of GaN to be under compressive stress due to the pseudomorphic growth at the interface. Repeating the process (i.e. the alternating growth of the GaN layers and the interlayers of AlN) n times can be used to further reduce or engineer strain in a final GaN or III-N layer.

With a strain engineered upper layer 12 of GaN in place, a layer 14 of III-III-N semiconductor material, in this preferred example AlGaN, is epitaxially grown on layer 12. While AlGaN is described in conjunction with this specific example, it should be understood that other III-III-N semiconductor material, such as InAlN, AlGaN, or combinations thereof (e.g. AlN where the Ga component is zero or near), could be included. Layer 14 of III-III-N semiconductor material forms a barrier layer in conjunction with GaN layer 12, which is the active or channel layer of the device. Layer 14 of III-III-N semiconductor material is specifically selected to form, in conjunction with III-N layer 12, a heterojunction with 2DEG in GaN channel layer 12 at the interface. It will be understood that while specific III-N materials (e.g. III-N/III-III-N combinations) are described herein, any combination of III-N material layers that form a heterojunction at the interface are included herein. While a single heterojunction device is illustrated and disclosed, it should be understood that other heterostructures with multiple heterojunctions can be fabricated using the present invention.

Figure 5:
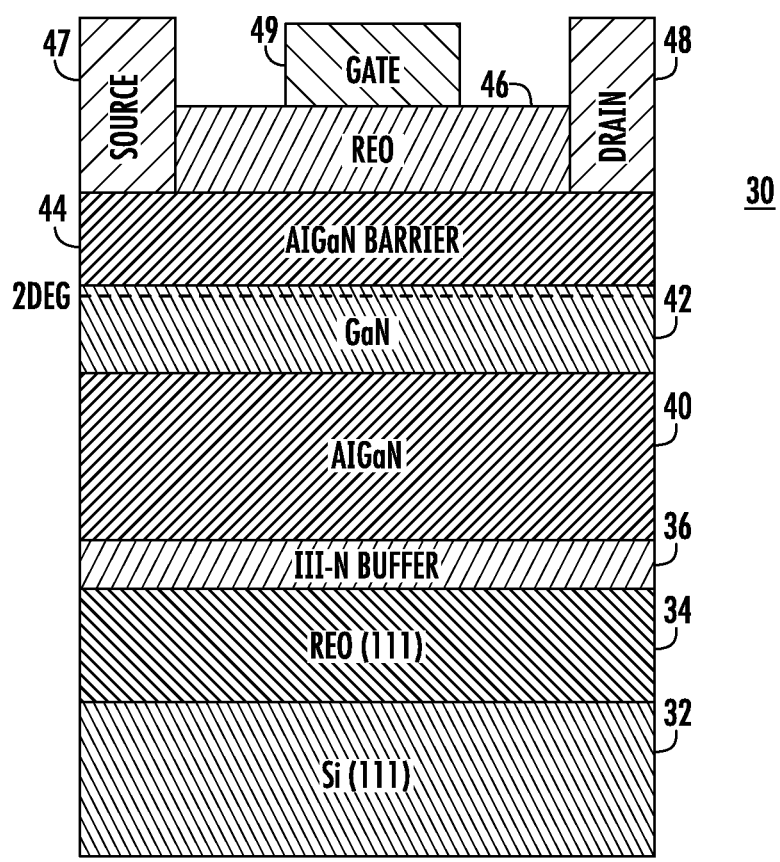
FIG. 5 is a simplified layer diagram illustrating a basic structure for a double HEMI device.

For example, a double HEMI can be fabricated by including AlGaN—GaN—AlGaN or any of the above described III-III-N materials. A simplified example of a double HEMI structure 30 is illustrated in FIG. 5. HEMI 30 includes a substrate 32, a REO template 34 and a III-N buffer layer 36 included to reduce the strain and allow the epitaxial growth of a first AlGaN barrier layer 40. A GaN active layer 42 is grown on AlGaN layer 40 and a second AlGaN barrier layer 44 is grown on GaN layer 42. A REO gate dielectric layer 46 is grown on second AlGaN barrier layer 44 and source, drain and gate areas and contacts 47, 48 and 49, respectively, are formed as described in more detail below. A specific layer diagram illustrating a generic basic structure for a double heterostructure on a REO template is illustrated in FIG. 6 and the same structure is illustrated in FIG. 7 with specific amounts of materials included.

Figure 6:
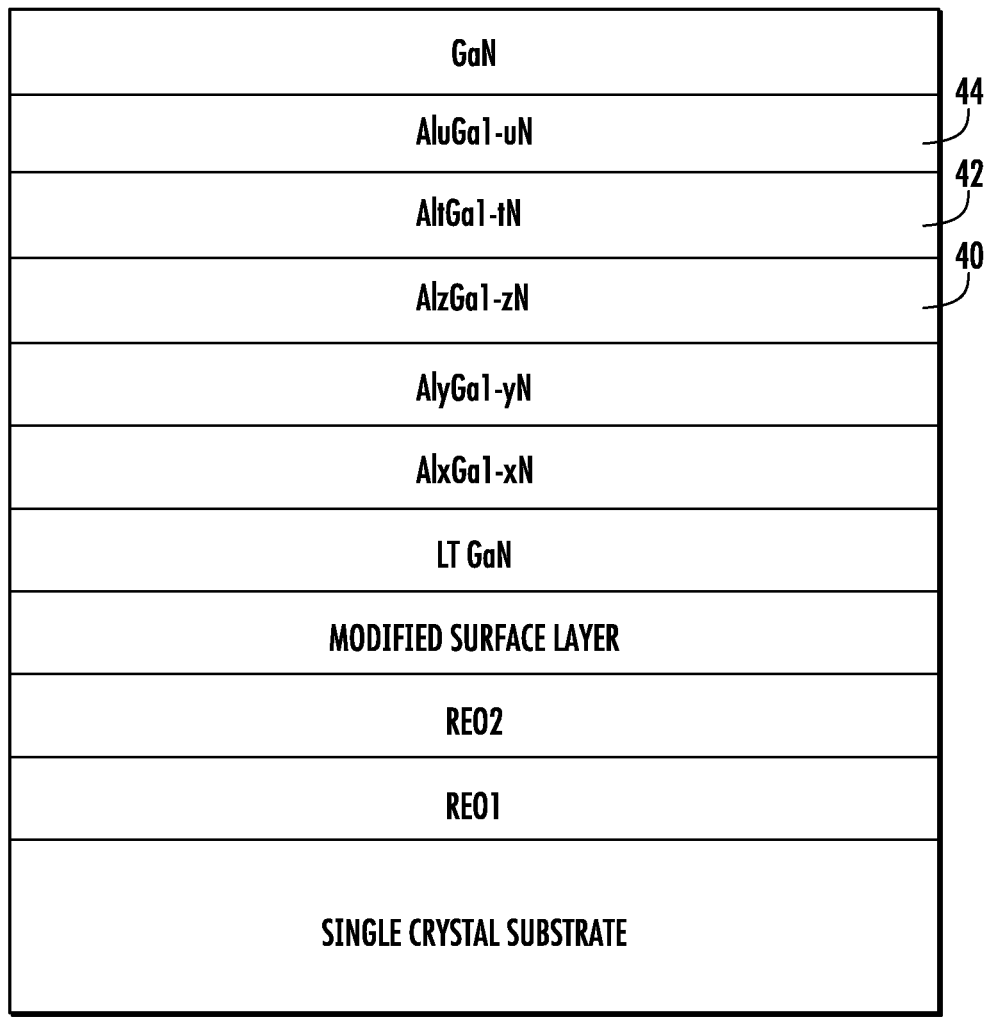
FIG. 6 is a simplified layer diagram illustrating a generic basic structure for a double heterostructure on a REO template.
Figure 7:
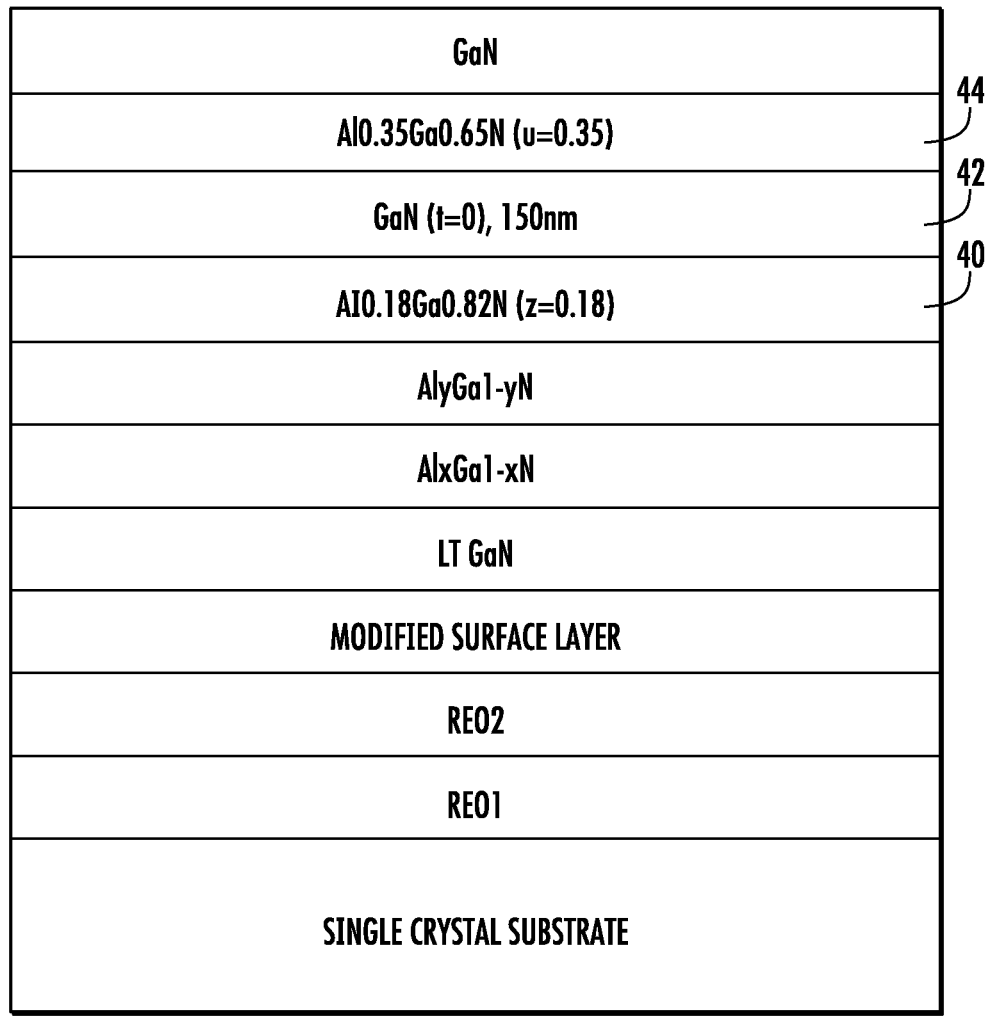
FIG. 7 is a simplified layer diagram illustrating a specific basic structure for a double heterostructure on a REO template.

Referring specifically to FIG. 6, an $Al_uGa_{1-u}$ N layer 44 is an upper barrier layer. An $Al_tGa_{1-t}$N layer 42 becomes the GaN channel layer when t goes to 0 and an $Al_zGa_{1-x}$N layer 40 forms a lower or back barrier. GaN layer 42 is a thin layer (e.g. approximately 150 nm) that is very clean high purity GaN in which the 2DEG electrons are located. Back barrier layer 40 is sufficiently close (i.e. abutting) to GaN layer 42 to raise the conduction band edge above that of GaN and increase carrier confinement in channel layer 42.

In a preferred method referring back to FIG. 1, a gate dielectric layer 16 of single crystal REO is epitaxially grown on the upper surface of III-N layer 14. Gate dielectric layer 16 is not exactly crystal lattice matched to the III-N material of layer 14 because the lattice constant of the rare earth oxide is larger than the III-N material. However, the REO material is single crystal and is polymorphous which means the crystal structure is different than the crystal structure of bulk REO material. Bulk REO material normally has a cubic structure (the type of rare earth oxide used in the present case) while the crystal structure of the REO in gate dielectric layer 16 is monoclinic because it is grown on III-N layer 14 which has a hexagonal crystal structure.

Because gate dielectric layer 16 is epitaxially grown on the upper surface of III-N layer 14, the various layers can be grown in situ, that is without removing the structure from the growth chamber, which substantially simplifies the method. Further, there may be an advantage in using the same materials for template layer 11 and gate dielectric layer 16. Thus, the entire structure including template 11 and, layers 12, 14, and 16 can be grown on substrate 10 in one continuous operation. Layer 16 serves as a high k gate dielectric layer for a device formed thereon, such as a High Electron Mobility Transistor (HEMT) or other field effect transistor, laser, photonic device, or the like. Generally, the dielectric constant of REO (more than 14) is higher if compared to that of $SiO_2$ (3.9) and $Si_3N_4$ (7.5) and the REO bandgap is between 5 eV and 6 eV with almost symmetric band off-set to GaN, for example, in both valence and conduction bands. Also, because layer 16 is a single crystal material dangling bonds that could act as charge trap centers in any device are substantially avoided and leakage current through interstices is reduced.

With gate dielectric layer 16 positioned on III-N active layer 14, a source 17 and a drain 18 is formed in III-N active layer 12 by any well-known method, such as implanting dopants. In a typical procedure gate dielectric layer 16 is grown and masked to define a channel in active layer 12 and the source/drain implants are automatically aligned. Source/drain contacts 17/18 can then be formed in a typical metallization process and a gate stack 19 is formed on the upper surface of gate dielectric layer 16 to define a semiconductor device 20 such as an HEMI. While this description only illustrates a single semiconductor device 20 (e.g. HEMT or FET) for a complete understanding, it will be understood that anything from discrete devices to complete circuits can be formed using the same methods.

Figure 2:
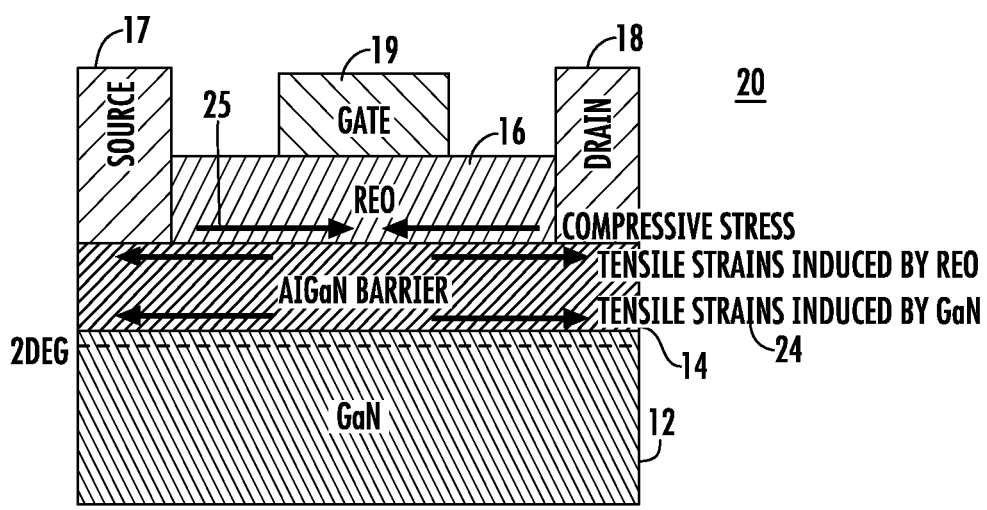
FIG. 2 is a simplified layer diagram illustrating a REO gate dielectric on a III-N device with representative stress and strains induced by the REO template and the REO gate dielectric, in accordance with the present invention.

Turning now to FIG. 2, representative stress and strains are illustrated in III-N device 20 induced by REO gate dielectric 16, in accordance with the present invention. Here it should be understood that the crystal structure, either simply cubic or trending toward hexagonal, of REO layer 11 allows the reduction of stress in GaN layer 12. However, AlGaN layer 14 is not lattice matched to GaN layer 12 because the AlGaN layer has a smaller lattice spacing than the GaN layer which induces tensile strain into AlGaN layer 14. The lattice constant of REO layer 16 is larger than the lattice constant of barrier layer 14 which induces compressive stress in REO layer 16 and consequent tensile strain in barrier layer 14. By engineering the crystal structure or spacing between REO dielectric layer 16 and III-III-N layer 14, a desired amount of desirable stress/strain can be induced into the interface with active GaN layer 12.

Compressive stress, represented by arrows 25 is induced at the interface between REO gate dielectric layer 16 and barrier layer 14. Generally, the lattice constant of REO layer 16 is larger than the lattice constant of barrier layer 14 which induces compressive stress in REO layer 16 and consequent tensile strain (represented by arrows 25) in barrier layer 14. Referring to FIG. 3, some comparisons of lattice parameters of III-N material (e.g. GaN) with some cubic rare earth oxides are illustrated to show various stress and strain engineering possibilities. The combination of the tensile strain (arrows 24) and the compressive stress (arrows 25) leads to an increase of piezoelectric field which leads to higher positive charge at the interface between barrier layer 14 and active GaN layer 12 and, consequently, higher electron density in 2DEG at the active GaN layer 12 interface. Thus, REO gate dielectric layer 16 reduces leakage current in the semiconductor device and REO template 11 cooperates with REO gate dielectric layer 16 to enhance charge carrier concentration in 2DEG.

Figure 4:
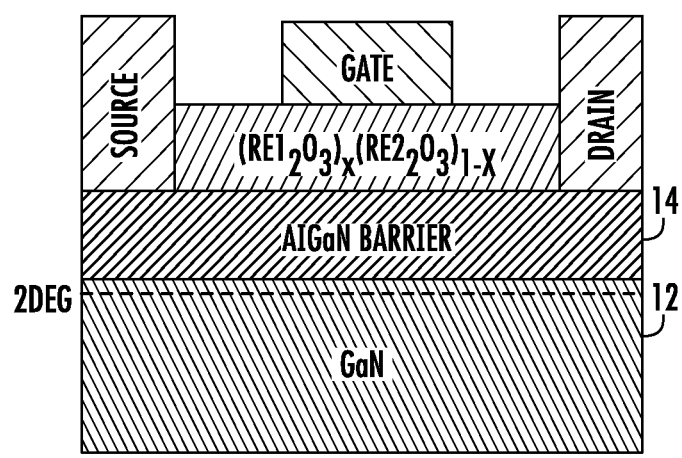
FIG. 4 is a simplified layer diagram illustrating a specific example of a REO gate dielectric.

While binary rare earth oxides ($Gd_2O_3$, $Er_2O_3$, $Yb_2O_3$, $Sc_2O_3$, $Y_2O_3$, etc.) are illustrated generally, it should be understood that ternary rare earth oxides (e.g. $Er_2O_3$, $Y_2O_3$. etc.) with combinations represented by $(RE1_2O_3)_x(RE2_2O_3)_{1-x}$, where x can be adjusted from 0 to 1, can be used for desired strain engineering and consequently for adjustment of charge carrier concentration in 2DEG at the interface between barrier layer 14 and active GaN layer 12, as illustrated in FIG. 4.

Thus, new and improved methods for the growth of III-N material and devices on a silicon substrate are disclosed. The new and improved methods for the III-N material include the growth of an engineered stress/strain that induces a piezoelectric field which leads to higher positive charge at the heterojunction (e.g. in this specific example the AlGaN/GaN interface) and consequently in higher electron density in 2DEG. The high k rare earth gate dielectric layer is grown epitaxially on the III-N active layer in what can be a continuous or in situ operation. The rare earth gate dielectric layer has sufficient dielectric constant and a proper bandwidth offset for the formation of high performance electronic components, such as HEMTs, FETs, lasers, and other photonic devices, and the like, in the III-N layer.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A heterostructure on a silicon substrate comprising:
   a single crystal silicon substrate;
   a single crystal rare earth oxide template positioned on the silicon substrate, the template being substantially crystal lattice matched to the surface of the silicon substrate;
   a heterostructure positioned on the template and defining at least one heterojunction at an interface between a III-N layer and a III-III-N layer, the template and the heterostructure being crystal matched to reduce stress/strain in the heterostructure; and
   a single crystal rare earth oxide dielectric layer grown on the heterostructure so as to induce compressive stress in the dielectric layer and tensile strain at the at least one heterojunction, the compressive stress in the dielectric layer and the tensile strain in the III-III-N layer combining to induce a piezoelectric field leading to higher carrier concentration in 2DEG at the heterojunction.

2. The heterostructure on a silicon substrate as claimed in claim 1 wherein the heterostructure includes a double heterojunction.

3. The heterostructure on a silicon substrate as claimed in claim 2 wherein the double heterojunction is defined by a first III-III-N layer positioned on a III-N layer which is in turn positioned on a second III-III-N layer.

4. The heterostructure on a silicon substrate as claimed in claim 3 wherein the first III-III-N layer includes AlGaN, the III-N layer includes GaN and the second III-III-N layer includes AlGaN.

5. The heterostructure on a silicon substrate as claimed in claim 3 wherein the single crystal rare earth oxide dielectric layer includes one of a binary rare earth oxide and a ternary rare earth oxide.

6. A heterostructure on a silicon substrate comprising:
   a single crystal silicon substrate;
   a single crystal rare earth oxide template positioned on the silicon substrate, the template being substantially crystal lattice matched to the surface of the silicon substrate;
   a III-N layer positioned on the surface of the template, the III-N layer being crystal lattice matched to the template so as to reduce stress/strain in the III-N layer;
   a barrier layer of single crystal III-III-N material grown on the upper surface of the III-N layer and defining an interface between the III-N layer and the III-III-N layer, the single crystal III-N material having a larger lattice constant than the III-III-N layer and defining a heterojunction with 2DEG at the interface; and
   a single crystal rare earth oxide dielectric layer grown on the active layer of III-III-N material so as to induce compressive stress in the rare earth oxide layer and tensile strain in the III-III-N layer, the tensile strain in the III-III-N layer and the compressive stress in the rare earth oxide layer combining to induce a piezoelectric field leading to higher carrier concentration at the heterojunction.

7. The heterostructure on a silicon substrate as claimed in claim 6 wherein the template includes one or more layers of single crystal rare earth oxide.

8. The heterostructure on a silicon substrate as claimed in claim 7 wherein the template includes a composition including multiple rare earth oxides one of graded to bridge the multiple rare earth oxides or stepped to have an abrupt change in the rare earth oxides.

9. The heterostructure on a silicon substrate as claimed in claim 8 wherein the composition including multiple rare earth oxides includes a first rare earth oxide adjacent the silicon substrate having a crystal lattice spacing substantially matching a double lattice spacing of silicon and a second rare earth oxide adjacent the III-N layer having a crystal lattice spacing substantially matching a crystal lattice spacing of the III-N layer.

10. The heterostructure on a silicon substrate as claimed in claim 6 wherein the single crystal rare earth oxide dielectric layer forms a gate dielectric layer and is patterned to define a device channel in the active layer of single crystal III-N material.

11. The heterostructure on a silicon substrate as claimed in claim 10 further including a source and a drain formed in the active layer of single crystal III-N material on opposite sides of the single crystal rare earth dielectric layer and further including source and drain contacts formed on the source and drain and a gate stack formed on the single crystal rare earth dielectric layer.

12. The heterostructure on a silicon substrate as claimed in claim 6 wherein the III-N layer includes one of GaN, AlN, InN, and combinations thereof.

13. The heterostructure on a silicon substrate as claimed in claim 6 wherein the barrier layer of single crystal III-III-N material includes one of AlGaN, InAlN, and combinations thereof.

14. The heterostructure on a silicon substrate as claimed in claim 6 wherein the single crystal rare earth oxide dielectric layer includes one of a binary rare earth oxide and a ternary rare earth oxide.

15. A method of growing heterostructure on a silicon substrate comprising the steps of:
   Providing a single crystal silicon substrate;
   growing or depositing a single crystal rare earth oxide template on the silicon substrate, the template being substantially crystal lattice matched to the surface of the silicon substrate;
   growing or depositing a heterostructure on the template, the heterostructure defining at least one heterojunction at an interface between a III-N layer and a III-III-N layer, the template and the heterostructure being crystal matched to reduce stress/strain in the heterostructure; and
   growing or depositing a single crystal rare earth oxide dielectric layer on the heterostructure so as to induce compressive stress in the rare earth oxide dielectric layer tensile strain at the at least one heterojunction, the tensile strain being induced in the III-III-N layer, and the compressive stress in the rare earth oxide dielectric layer combining with the tensile strain in the III-III-N layer to induce a piezoelectric field leading to higher carrier concentration at the heterojunction.

16. The method as claimed in claim 15 wherein the step of growing or depositing the heterostructure includes growing or depositing a double heterojunction.

17. The method as claimed in claim 16 wherein the step of growing or depositing the double heterojunction includes growing or depositing a first III-III-N layer on a III-N layer which is in turn grown or deposited on a second III-III-N layer.

18. The method as claimed in claim 16 wherein the first III-III-N layer includes AlGaN, the III-N layer includes GaN and the second III-III-N layer includes AlGaN.

19. The method as claimed in claim 15 wherein the step of growing or depositing the single crystal rare earth oxide dielectric layer includes growing or depositing one of a binary rare earth oxide and a ternary rare earth oxide.

20. A method of growing a heterostructure on a silicon substrate comprising the steps of:
  providing a single crystal silicon substrate;
  growing or depositing a single crystal rare earth oxide template on the silicon substrate, the template being substantially crystal lattice matched to the surface of the silicon substrate;
  growing or depositing a single crystal III-N layer on the surface of the template, the III-N layer being crystal lattice matched to the template so as to reduce stress/strain in the III-N layer;
  growing or depositing a barrier layer of single crystal III-III-N material on the upper surface of the III-N layer and defining an interface between the III-N layer and the III-III-N layer, and the single crystal III-N material having a larger lattice constant than the III-III-N layer to define a heterojunction with 2DEG at the interface; and
  growing or depositing a single crystal rare earth oxide dielectric layer on the barrier layer of III-III-N material inducing compressive stress in the single crystal rare earth oxide dielectric layer and tensile strain in the III-III-N layer and the compressive stress in the III-III-N layer, the compressive stress and tensile strain combining to induce a piezoelectric field leading to higher carrier concentration at the heterojunction.

21. The method of claim 20 wherein the step of growing or depositing a single crystal template includes epitaxially growing one or more layers of single crystal rare earth oxide.

22. The method as claimed in claim 21 wherein the step of growing one or more layers of single crystal rare earth oxide includes a step of forming a composition including multiple rare earth oxides one of graded to bridge the multiple rare earth oxides or stepped to have an abrupt change in the rare earth oxides.

23. The method as claimed in claim 22 wherein the step of forming the composition includes epitaxially growing a first rare earth oxide adjacent the silicon substrate having a crystal lattice spacing substantially matching a double lattice spacing of silicon and epitaxially growing a second rare earth oxide adjacent the III-N layer having a crystal lattice spacing matching a crystal lattice spacing of the III-N layer and engineered to reduce stress/strain in the III-N layer.

24. The method as claimed in claim 21 wherein the step of growing or depositing one or more layers of the single crystal rare earth oxide includes a step of growing or depositing a composition including multiple rare earth oxides.

25. The method as claimed in claim 20 further including the steps of forming the single crystal rare earth oxide dielectric layer into a gate dielectric layer and patterning the gate dielectric layer to define a device channel in the active layer of single crystal III-N layer.

26. The method as claimed in claim 25 further including a step of forming a source and a drain in the active layer of single crystal III-N material on opposite sides of the single crystal gate dielectric layer and further including forming source and drain contacts on the source and drain and forming a gate stack on the single crystal gate dielectric layer.

27. The method as claimed in claim 20 wherein the steps of growing or depositing a single crystal template, growing or depositing a III-N structure, growing or depositing a barrier layer of single crystal III-III-N layer, and growing or depositing a single crystal rare earth oxide dielectric layer are all performed in situ or in a continuous operation.

28. The method as claimed in claim 20 wherein the step of growing or depositing the barrier layer of single crystal III-III-N material includes growing or depositing a layer of one of AlGaN and InAlN.

29. The method as claimed in claim 20 wherein the step of growing or depositing the single crystal rare earth oxide dielectric layer includes growing or depositing one of a binary rare earth oxide and a ternary rare earth oxide.

* * * * *